(12) United States Patent
Chen et al.

(10) Patent No.: US 6,664,859 B1
(45) Date of Patent: Dec. 16, 2003

(54) STATE MACHINE BASED PHASE-LOCK-LOOP FOR USB CLOCK RECOVERY

(75) Inventors: Jen-Ying Chen, Tainan Hsien (TW); Gow-Jeng Lin, Hsin-Chu (TW); Chien-Ming Chen, Chang-Hua Hsien (TW)

(73) Assignee: Faaday Technology Crop., Hsin-Chu (TW)

( * ) Notice: Subject to any disclaimer, the term of this patent is extended or adjusted under 35 U.S.C. 154(b) by 0 days.

(21) Appl. No.: 10/065,040

(22) Filed: Sep. 13, 2002

(51) Int. Cl.[7] ................................................. H03L 7/00
(52) U.S. Cl. .......................................... 331/1 A; 331/25
(58) Field of Search ............................ 331/1 A, 16, 17, 331/18, 25; 327/156–159; 375/376; 455/260

(56) References Cited

U.S. PATENT DOCUMENTS

| | | | | |
|---|---|---|---|---|
| 5,297,869 A | * | 3/1994 | Benham | ...................... 375/361 |
| 5,811,998 A | * | 9/1998 | Lundberg et al. | ........... 327/156 |
| 5,861,842 A | * | 1/1999 | Hitch et al. | ............. 342/357.15 |
| 6,088,811 A | | 7/2000 | Liew et al. | |

* cited by examiner

*Primary Examiner*—David C. Mis
(74) *Attorney, Agent, or Firm*—Winston Hsu

(57) ABSTRACT

A single mode state machine for recovering the Universal Serial Bus (USB) clock from the USB. The claimed state machine running at 4X speed includes only five states and generates a 1X speed clock. When transmitting, the claimed invention acts as a divide-by-four counter and divides the 4X clock into a 1X clock to be used by control logic (for example, a Serial Interface Engine). When receiving, the same state group acts as a divide-by-four counter with the received data's status being continuously monitored to reset the state machine to an original state to dynamically adjust the duty cycle of the receiving clock. The exact selection of transition path is determined by the logical AND of a phase change within the data and a signal indicating whether the state machine is currently transmitting or receiving.

20 Claims, 5 Drawing Sheets

STATE MACHINE BASED PHASE-LOCK-LOOP FOR USB CLOCK RECOVERY

BACKGROUND OF INVENTION

1. Field of the Invention

The present invention relates to clock signal generation. More specifically, the present invention relates to a state machine based phase-lock-loop generator of clock signals for a Universal Serial Bus (USB) protocol.

2. Description of the Prior Art

A Universal Serial Bus is a high-speed serial bus for communicating between a host computer and one or more USB devices, or more recently between two USB devices. The host and each USB device comprise a Serial Interface Engine (SIE) to provide an interface between the devices and to handle low-level USB functions such as error checking, hand-shaking, and token generation.

The SIE must generate transmit and receive clock signals to insure synchronization between the devices. Obviously for two-way communication between the devices, each device must include both a transmit clock and a receive clock. The transmit clock signal has a regular duty cycle and normally operates at 12 MHz or at 1.5 Mhz for slow devices. The receive clock cycle may be stretched or shrunk to accommodate data jitter in the USB and still latch on to the transmitting clock's signal as discussed in the USB specification.

One conventional clock scheme uses an analog phase-lock-loop (APLL) device. This method can introduce process dependencies, reduces re-usability, and has generally been replaced by digital state machines.

Early attempts at using a digital phase-lock-loop (DPLL) state machine required separate transmit and receive clocks and an outside circuit to select the appropriate clock. In an effort to eliminate possible malfunctioning of the selecting circuit and the difficulties with designing and maintaining a selecting circuit, U.S. Pat. No. 6,088,811 discloses a DPLL state machine replacing the selecting circuit with an intermediate state and is hereby included by reference. The intermediate state forms a bridge between two distinct groups of states (one for transmitting and one for receiving) and allows alternation between the two modes (groups of states) as appropriate to form a single DPLL state machine.

While the above-described disclosure does represent an improvement over the previous prior art, it still requires a complex design of two separate groups of states, an intermediate state, and complex circuitry to avoid entering undefined states.

SUMMARY OF INVENTION

It is therefore an objective of the claimed invention to provide a single mode state machine that uses a single group of states to simplify the complex circuitry in a state machine based phase-lock-loop (PLL) scheme for recovering the Universal Serial Bus (USB) clock from the USB.

The claimed state machine running at 4X speed includes only five states and generates a 1X speed clock. When transmitting, the claimed invention acts as a divide-by-four counter and divides the 4X clock into a 1X clock to be used by control logic (for example, a Serial Interface Engine). When receiving, the same state group acts as a divide-by-four counter with the received data's status being continuously monitored to dynamically adjust the duty cycle of the receiving clock.

The claimed invention changes from one state to another along predefined paths.

The exact selection of path is determined by the logical AND of a phase change within the data and a signal indicating whether the state machine is currently transmitting or receiving.

It is an advantage of the claimed invention that a single mode clock with a single group of 5 states is used for both transmitting and receiving USB signals. The claimed invention uses a single group of states to simplify design and reduce circuitry complexity, manufacturing costs, and power consumption in a PLL scheme to recover the Universal Serial Bus (USB) clock from the USB. The small size of the state machine facilitates implementation in only three bit registers.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 1:
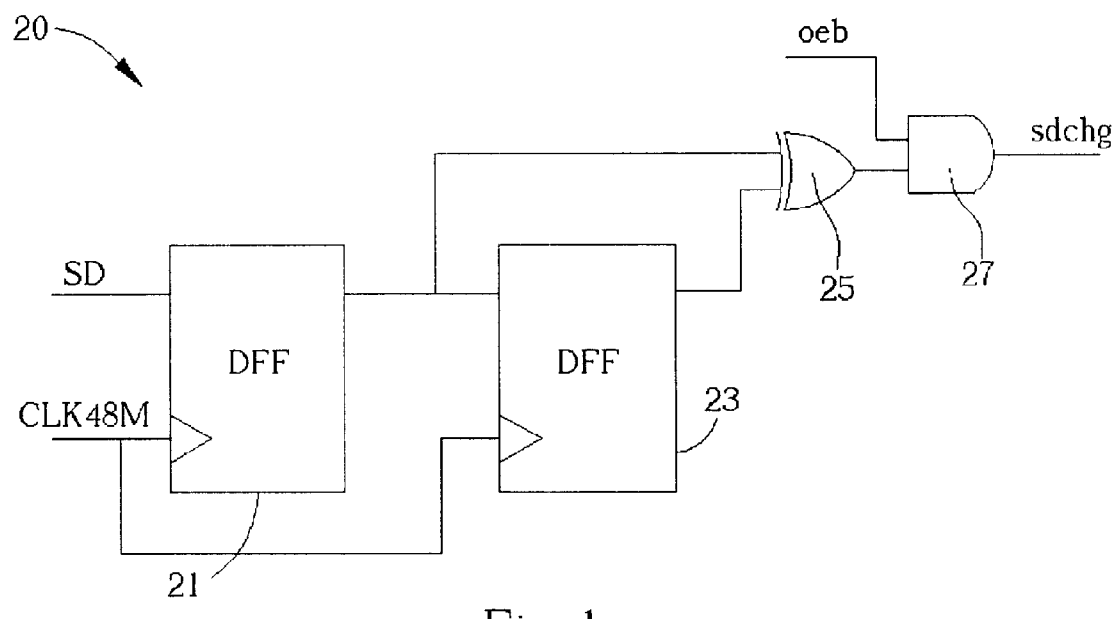
FIG. 1 is a block diagram of a control circuit to control a phase-lock-loop state machine according to the present invention.

FIG. 1 is a block diagram of a control circuit 20 to control a phase-lock-loop state (PLL) according to the present invention. The control circuit 20 comprises a first D-flip-flop circuit 21, a second D-flip-flop circuit 23, an XOR operator 25, and an AND operator 27.

The first D-flip-flop circuit 21 comprises an input for receiving serial data, a second input for receiving an externally generated clock signal, and an output for the delayed serial data. In the example embodiment, the externally generated clock signal alternates at 48 MHz., but the present invention is not to be limited to this value.

The second D-flip-flop circuit 23 comprises an input for receiving the external clock signal, another input for receiving the serial data that has been delayed and outputted by the first D-flip-flop circuit 21, and an output for the delayed serial data.

The XOR operator comprises an input for receiving the delayed serial data outputted from the first D-flip-flop circuit 21, another input for receiving the again delayed serial data outputted from the second D-flip-flop circuit 23, and an output that is connected to one input of the AND operator 27. A second input of the AND operator 27 receives an Output Enable Bar (OEB) signal from a control logic device to indicate whether the present invention is to function as a receiving clock or as a transmitting clock. The output of the AND operator 27 outputs a Serial Data Change (sdchg) signal that controls the transitions between states in the PLL state machine.

Figure 2:
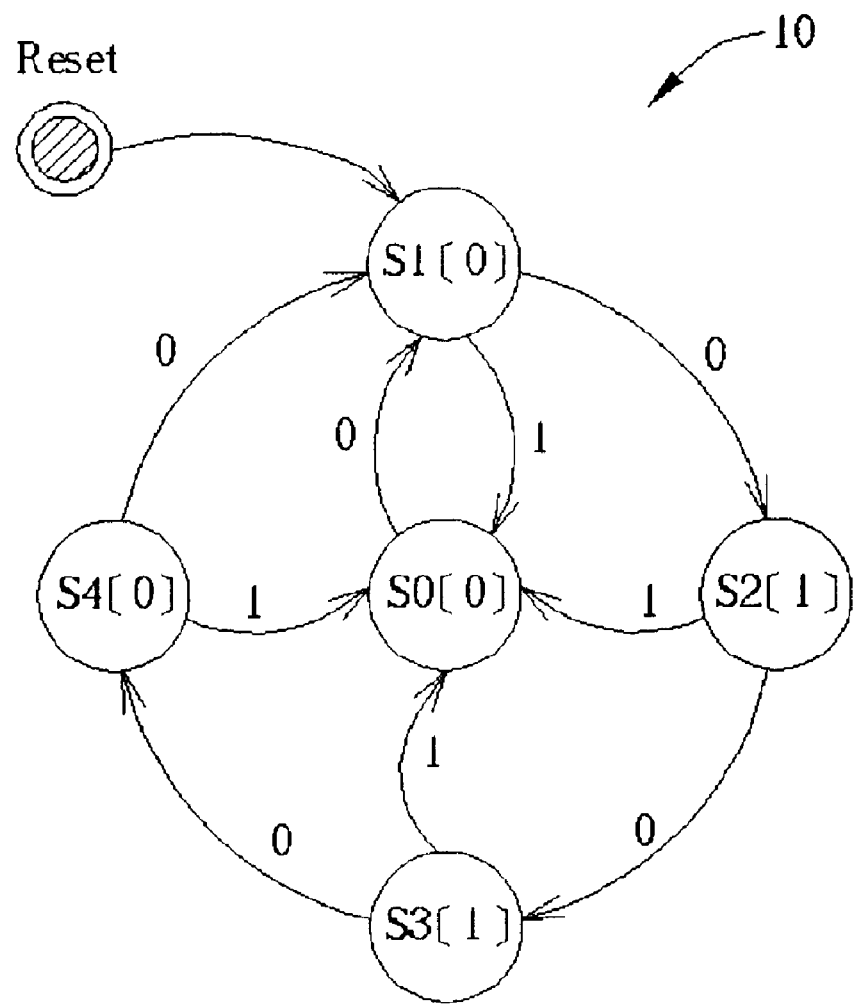
FIG. 2 is an example of the phase-lock-loop state machine of FIG. 1.

FIG. 2 is an example of the PLL state machine 10 according to the present invention. The PLL state machine 10 comprises five states S0, S1, S2, S3, and S4. Immediately next to the name of each state is a set of brackets enclosing a "1" or a "0" representing the clock value that is supplied as a clock signal while in that particular state. Possible transitions from one state to another are shown in FIG. 2 as one-way arrows. Each transition in FIG. 2 has a "1" or a "0" associated with that particular transition and indicates condition of the sdchg signal at the time that the transition is begun.

For example, if receiving a perfect data stream, the sdchg signal may read 0→0→1→0, the reset PLL state machine 10 beginning in S1 would follow the path S2→S3→S0→S1 and generate clock signals of 1→1→0→0 achieving a clock rate at exactly one-fourth of the external clock. Please note that when the PLL state machine 10 acts as a receiving clock, the OEB signal is always high so that the sdchg signal actually depends only on the output of the XOR operator 25. On the other hand, when the PLL state machine functions as a transmitting clock, the OEB signal is always low so the sdchg signal is always low. This allows the PLL state machine 10 to function as a simple divide-by-four clock when transmitting and to dynamically adjust the duty cycle to latch onto a transmitting clock when serving as a receiving clock.

Figure 3:
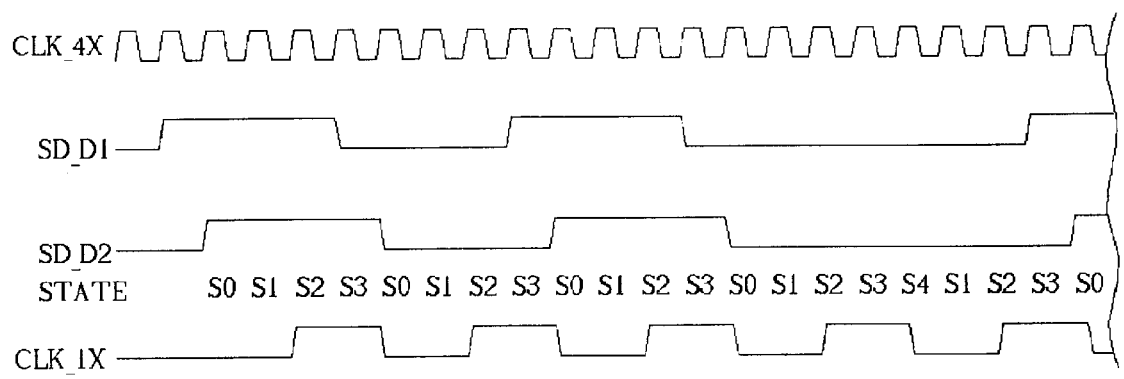
FIGS. 3–5 are charts illustrating the output of the phase-lock-loop state machine of FIG. 1 with differing bit times.

FIG. 3 is a chart illustrating the PLL state machine 10 in operation when receiving standard bit time showing how a 1X clock is derived from an externally generated 4X clock. The square wave SD_D1 represents the serial data outputted from the first D-Flip-Flop circuit 21. The square wave SD_D2 represents the serial data outputted from the second D-Flip-Flop circuit 23. The chart begins with the PLL state machine in the state S0. Note that the state S0 outputs a "0" which indicates the low level of the CLK_1X clock. Because the waves SD_D1 and SD_D2 are not in opposition with each other (here, both are high), the XOR operator 27 outputs a "0" to the AND operator 27, which obviously also outputs a "0" as the sdchg signal.

Because the sdchg signal is a "0", the PLL state machine 10 transits along the transition arrow marked with a "0" to state S1. The state S1 also outputs a "0" for a clock signal as shown in FIG. 3. While in the state S1, because SD_D1 and SD_D2 both remain in positive territory, the sdchg signal remains a "0" and the PLL state machine 10 transits to S2. The state S2 outputs a "1" as the clock signal as shown in the CLK_1X wave form under the state S2.

While in the state S2, again the SD_D1 and SD_D2 both remain in positive territory so the transition is made to the state S3. The state S3 keeps the CLK_1X at a high level. However, in the state S3, the SD_D1 signal goes low while the SD_D2 signal remains high, causing the XOR operator 25 to output a "1" that in turn causes the AND operator 27 to output a "1" as the sdchg signal. Therefore, the PLL state machine 10 transits to the state S0 again, outputting a "0" as shown in the CLK_1X wave form in FIG. 3.

The above cycle repeats until, near the left side of FIG. 3, the extended duration of a low serial data signal causes the PLL state machine to dynamically adjust by transitioning in the following order; S0→S1→S2→S3→S4→S1→S2→S3, effectively temporarily exchanging the states S0 and S4. Regardless, the PLL state machine 10 continues to output a perfect CLK_1X signal.

Figure 4:
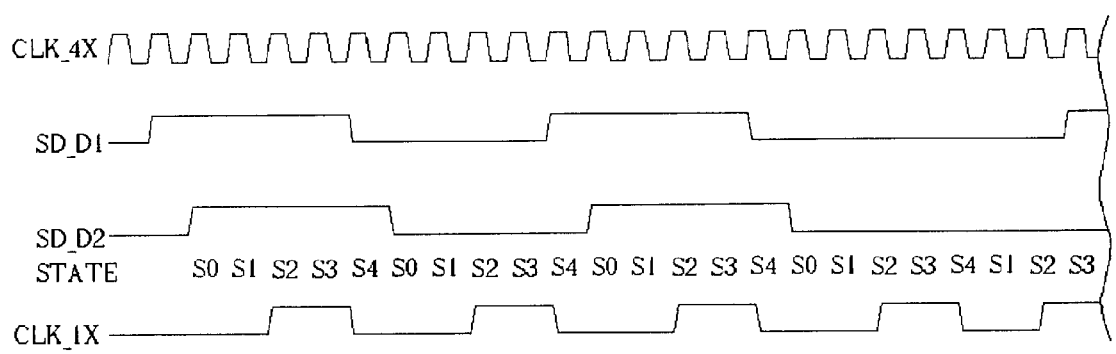

FIG. 4 illustrates the PLL state machine 10 when the transmitting clock is slower than the PLL state machine 10 acting as a receiving clock. The duty cycle is dynamically adjusted to include a transition to a fifth state to compensate for the differences in timing between the clocks. The normal cycle runs S0→S1→S2→S3→S4→S0, including both the S0 and the S4 states.

Figure 5:
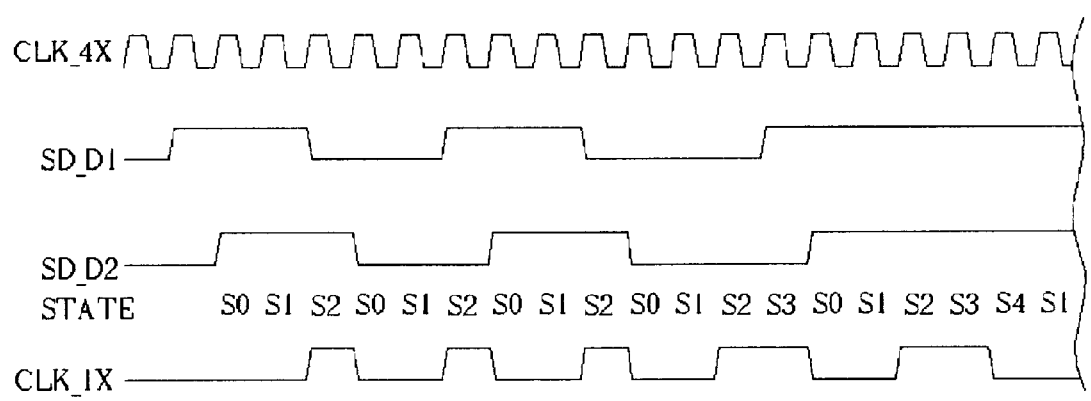

FIG. 5 shows the PLL state machine 10 when the transmitting clock is faster than the present invention functioning as a receiving clock. The duty cycle again is dynamically altered to adjust to timing differences by reducing the cycle to 3 states; S0→S1→S2→S0.

One big advantage over the prior art of the PLL state machine 10 is that of requiring only five states to perform the dual functions of acting as a transmitting clock generator with a constant duty cycle and using the same five states to generate a variable duty receiving clock. The simplicity of requiring only five states allows the PLL state machine to be implemented in only three bit registers, the value of which indicates the current state, obviously simplifying construction and reducing manufacturing costs.

In contrast to the prior art, the present invention uses a single mode clock with a single group of 5 states for both transmitting and receiving USB signals. The small size of the present invention allows the use of registers to maintain the states. The claimed PLL state machine uses a single group of states to simplify design and reduce circuitry complexity, manufacturing costs, and power consumption in a PLL scheme to recover the Universal Serial Bus (USB) clock from the USB.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus comprising a phase-lock-loop state machine for generating a digital clock signal, the phase-lock-loop state machine comprising:
   a first state for serving as an entry point after a reset and for generating a first clock signal;
   a second state for generating a second clock signal;
   a third state for generating the second clock signal;
   a fourth state for generating the first clock signal;
   a fifth state for generating the first clock signal;
   a transition from the first state to the second state on a first control signal;
   a transition from the first state to the fifth state on a second control signal;
   a transition from the second state to the third state on the first control signal;
   a transition from the second state to the fifth state on the second control signal;
   a transition from the third to the fourth state on the first control signal;
   a transition from the third state to the fifth state on the second control signal;
   a transition from the fourth state to the first state on the first control signal;
   a transition from the fourth state to the fifth state on the second control signal; and
   a transition from the fifth state to the first state on the first control signal;
   wherein transitions between the states occur at a predetermined frequency.

2. The apparatus of claim 1 further comprises a control circuit for selectively outputting the first control signal or the second control signal.

3. The apparatus of claim 2 wherein the control circuit comprises a delay circuit, an XOR operator, and an AND operator.

4. The apparatus of claim 2 wherein the control circuit comprises a first input for receiving a receiving signal indicating the phase-lock-loop state machine is to operate as a receiving clock.

5. The apparatus of claim 4 wherein the receiving signal is an output enable bar signal.

6. The apparatus of claim 4 wherein the control circuit further comprises a second input for receiving a data signal and a third input for receiving a clock signal from an external clock.

7. The apparatus of claim 6 wherein the control circuit outputs the first control signal or outputs the second control signal because of a logical AND of the data signal and the receiving signal.

8. The apparatus of claim 6 wherein the control signal outputs the first control signal or outputs the second control signal because of a logical AND of the receiving signal and a phase change in the data signal.

9. The apparatus of claim 6 wherein the external clock selectively operates at 48 MHz or selectively operates at 6 MHz.

10. The apparatus of claim 1 further comprises a register for implementing the phase-look-loop state machine.

11. An apparatus for synchronizing a Universal Serial Bus (USB) receiving clock with a USB transmitting clock, the receiving clock generated at one-fourth the frequency of an externally generated clock, the apparatus comprising:
   a control circuit for outputting a control signal in response to data received by the control circuit; and
   a digital phase-lock-loop state machine for dynamically adjusting the receiving clock's duty cycle according to the control signal to substantially synchronize the receiving clock with the transmitting clock.

12. The apparatus of claim 11 wherein the phase-lock-loop state machine comprises:
   a first state for serving as an entry point after a reset and for generating a first clock signal;
   a second state for generating a second clock signal;
   a third state for generating the second clock signal;
   a fourth state for generating the first clock signal;
   a fifth state for generating the first clock signal.

13. The apparatus of claim 12 wherein the phase-lock-loop state machine comprises:
   a transition from the first state to the second state on a first control signal;
   a transition from the first state to the fifth state on a second control signal;
   a transition from the second state to the third state on the first control signal;
   a transition from the second state to the fifth state on the second control signal;
   a transition from the third to the fourth state on the first control signal;
   a transition from the third state to the fifth state on the second control signal;
   a transition from the fourth state to the first state on the first control signal;
   a transition from the fourth state to the fifth state on the second control signal; and
   a transition from the fifth state to the first state on the first control signal.

14. The apparatus of claim 11 wherein the control circuit comprises a first input for receiving the received data and a second input for receiving a signal from the externally generated clock.

15. The apparatus of claim 14 wherein the control circuit further comprises a third input for receiving a receiving signal indicating the phase-lock-loop state machine is to operate as a receiving clock.

16. The apparatus of claim 15 wherein the control signal outputted from the control circuit is a logical AND of the receiving signal and a phase change in the received data.

17. The apparatus of claim 11 further comprises a register for implementing the phase-lock-loop state machine.

18. A method for synchronizing a receiving clock with a transmitting clock, the receiving clock comprising a control circuit and a five-state phase-lock-loop state machine to generate the receiving clock signal at one-fourth the frequency of an externally generated clock, the method comprising:
   the control circuit generating a first control signal if a phase change in data being received has occurred and generating a second control signal if a phase change in the data being received has not occurred;
   if in a first state, transitioning from the first state to a second state on the first control signal;
   if in the first state, transitioning from the first state to a fifth state on the second control signal;
   if in the second state, transitioning from the second state to a third state on the first control signal;
   if in the second state, transitioning from the second state to the fifth state on the second control signal;
   if in the third state, transitioning from the third to a fourth state on the first control signal;
   if in the third state, transitioning from the third state to the fifth state on the second control signal;
   if in the fourth state, transitioning from the fourth state to the first state on the first control signal;
   if in the fourth state, transitioning from the fourth state to the fifth state on the second control signal; and
   if in the fifth state, transitioning from the fifth state to the first state on the first control signal; and outputting the receiving clock signal according to the current state of the phase-lock-loop state machine.

19. The method of claim 18 further comprises:
   outputting a first clock signal in the first state;
   outputting a second clock signal in the second state;
   outputting the second clock signal in the third state;
   outputting the first clock signal in the fourth state;
   outputting the first clock signal in the fifth state.

20. The method of claim 18 further comprises resetting to an initial state if a reset signal is indicated.

* * * * *

UNITED STATES PATENT AND TRADEMARK OFFICE
CERTIFICATE OF CORRECTION

PATENT NO. : 6,664,859 B1
DATED : December 16, 2003
INVENTOR(S) : Chen et al.

It is certified that error appears in the above-identified patent and that said Letters Patent is hereby corrected as shown below:

<u>Title page,</u>
Item [73], Assignee, should read -- Faraday Technology Corp. --.

Signed and Sealed this

Thirteenth Day of September, 2005

JON W. DUDAS
*Director of the United States Patent and Trademark Office*